(12) United States Patent
Matsumoto (10) Patent No.: US 6,815,148 B2
(45) Date of Patent: Nov. 9, 2004

(54) METHOD OF MANUFACTURING A SEMICONDUCTOR DEVICE AND DESIGNING A MASK PATTERN

(75) Inventor: Akira Matsumoto, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 62 days.

(21) Appl. No.: 10/173,037

(22) Filed: Jun. 18, 2002

(65) Prior Publication Data

US 2002/0197567 A1 Dec. 26, 2002

(30) Foreign Application Priority Data

Jun. 20, 2001 (JP) ........................................ 2001-185976

(51) Int. Cl.[7] .............................................. G03F 7/26
(52) U.S. Cl. ...................... 430/313; 430/394; 430/396
(58) Field of Search ................................ 430/311, 313, 430/322, 327, 394, 396

(56) References Cited

U.S. PATENT DOCUMENTS 5,134,058 A * 7/1992 Han ............................ 430/327

FOREIGN PATENT DOCUMENTS

| JP | 2000-292903 | 10/2000 |
| JP | 2000-85538 | 3/2001 |

* cited by examiner

Primary Examiner—Kathleen Duda
(74) Attorney, Agent, or Firm—Foley & Lardner LLP (57) ABSTRACT

The present invention provides a method of manufacturing a semiconductor device and a method of designing a mask pattern which prevents dimensional errors caused by the difference in the resist film thickness, which is ascribed to a level-difference portion of an underlying layer. The present invention may be applied to transfer the pattern of a mask, which has a first pattern hole and a second pattern hole being different in size from each other, to a resist film covering an underlying layer having an uneven surface.

14 Claims, 6 Drawing Sheets

FIG. 6B

METHOD OF MANUFACTURING A SEMICONDUCTOR DEVICE AND DESIGNING A MASK PATTERN

BACKGROUND OF THE INVENTION

1. Field of the Invention

The present invention relates to a method of manufacturing a semiconductor device and more particularly, to such a method of manufacturing a semiconductor device as having a step of etching an underlying layer by using a photo resist film as a mask. The present invention further relates to a method of forming a photo-mask having a pattern such as a hole which is to be transferred to a photo resist film that is used as a mask for etching an underlying layer. The present application is based on Japanese Patent Application No. 2001-185976, which is incorporated herein by reference.

2. Description of the Related Art

In the lithography step, which is one of the steps of a process for manufacturing semiconductor devices, a resist film is applied to an underlying layer formed on a semiconductor substrate, and the exposure and development are performed on the resist film by use of a photo-mask to form a resist pattern (in other words, the pattern of the photo-mask being transferred to the resist layer), followed by the etching or impurity introduction being performed on the underlying layer by use of the resist pattern as a mask.

Figure 5A:
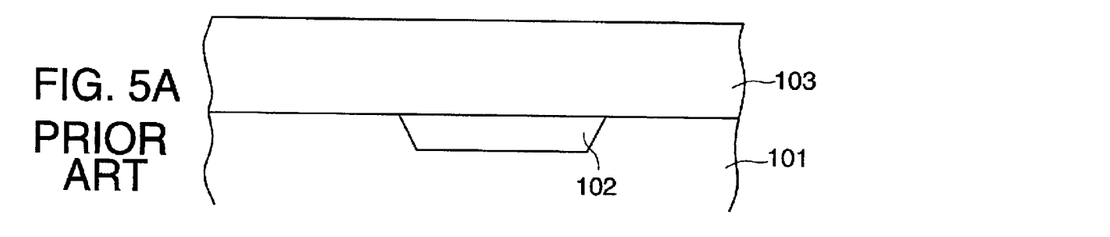
FIGS. 5A–5D show schematic views resist patterns in a prior art.
Figure 5B:
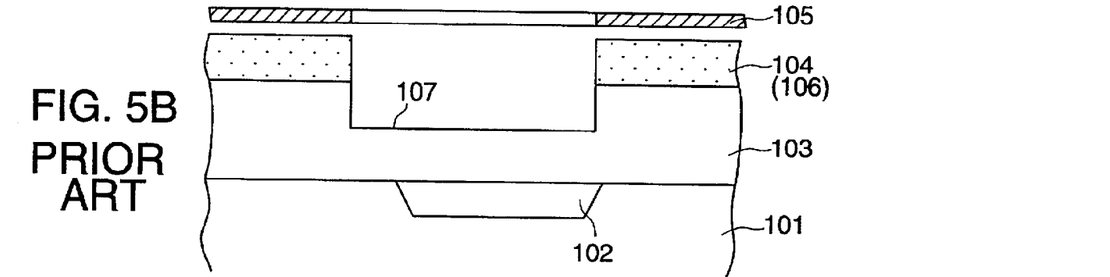
Figure 5C:
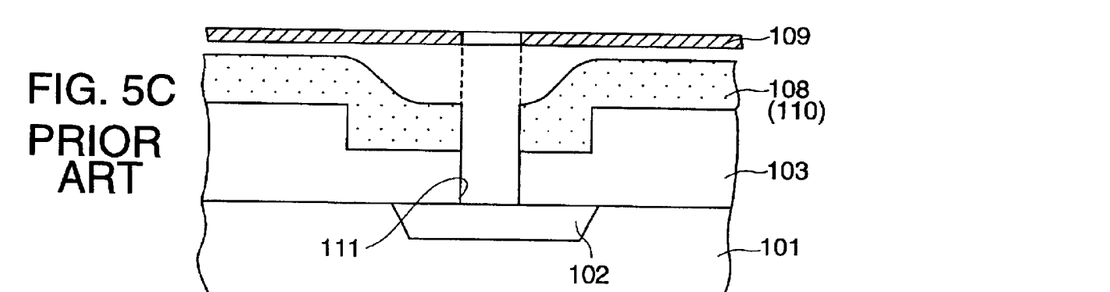
Figure 5D:
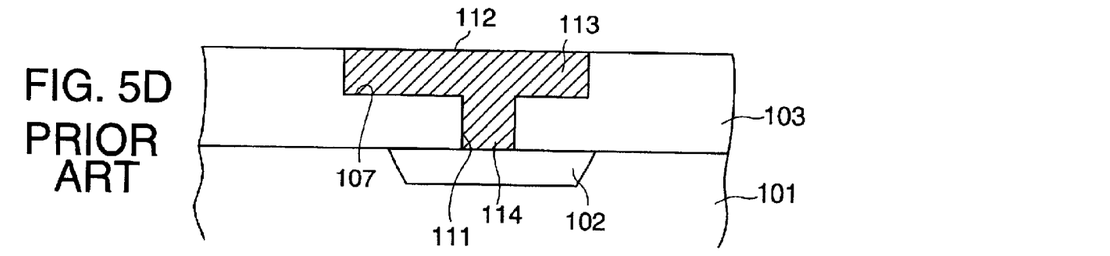

More detailed description will be made on the so-called dual-damascene interconnection structure of a trench first process type, which is taken as an example, with reference to FIGS. 5A to 5D. The dual-damascene interconnect having a trench interconnect (wiring) formed in a trench of an interlayer dielectric layer and a via hole electrically connecting the trench interconnect to a conductive layer (or an impurity region) formed under the interlayer dielectric layer. As shown in FIG. 5A, an interlayer dielectric 103 is formed with a prescribed film thickness on a semiconductor substrate 101 in which a conductive layer 102 of the underlying layer is formed. Next, as shown in FIG. 5B, a first resist film 104 is applied and by performing the exposure and development of the first resist film 104 by use of a first photo mask 105 having a mask pattern corresponding to an interconnect trench, a first resist pattern 106 of pattern shape corresponding to a trench inter connect is formed. After that, the above-described interlayer dielectric 103 is selectively etched to a prescribed thickness by use of this first resist pattern 106 as a mask and an interconnect trench 107 is formed. Subsequently, as shown in FIG. 5C, a second resist film 108 is applied to the whole surface and by performing the exposure and development of the second resist film 108 by use of a second photo mask 109 having a via pattern, a second resist pattern 110 of pattern shape corresponding to a via is formed in the above-described interconnect trench 107. After that, by use of this second resist pattern 110 as a mask the above-described interlayer dielectric 103 is selectively etched until the conductive layer 102 of the underlying layer is reached, whereby a via hole 111 that opens the conductive layer 102 of the underlying layer is formed. In addition, as shown in FIG. 5D, by filling the above-described interconnect trench 107 and via hole 111 with a conductive material 112, a trench interconnect 113 is formed in the interconnect trench 107 and a via 114 that electrically connects the trench interconnect 113 and the conductive layer 102 of the underlying layer is formed in the via hole 111.

In such process as described above, since the second resist film 108 is coated after forming the interconnect trench 107, the second resist film 108 is not formed with a uniform thickness, but formed such that its thickness over the inner (or central) portion of the interconnect trench 107 is smaller than that over the outer (or edge) portion of the trench 107. The inventor of the present invention has revealed that the difference in thickness of the photo resist film 18 over the trench 107 causes problems as described below.

Figure 6A:
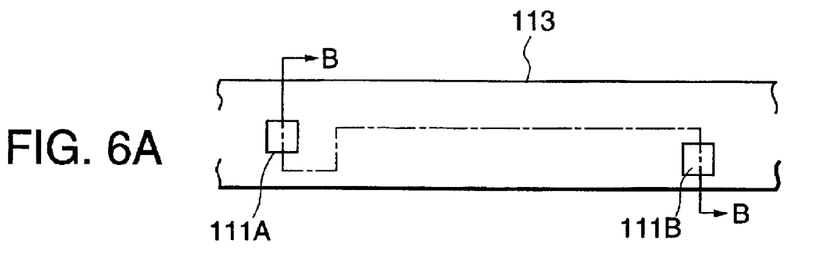
FIGS. 6A and 6B are explanatory views showing a problem of the prior art.
Figure 6B:
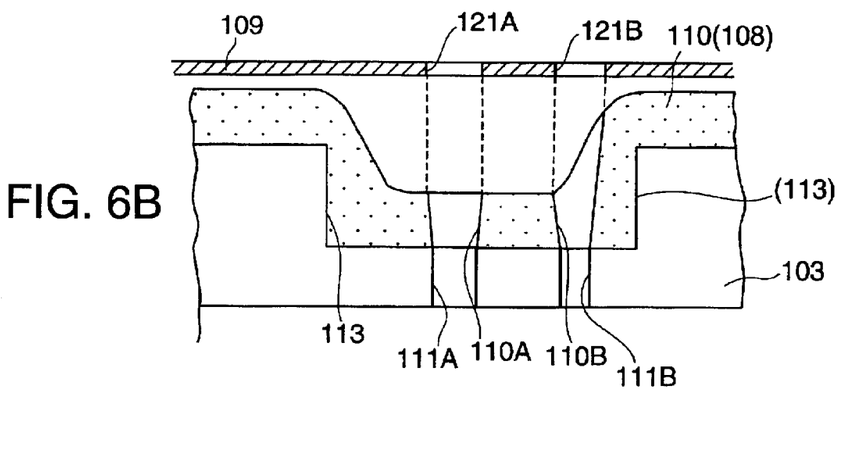

Specifically, a via hole is not always formed in substantially the middle of an interconnect trench, and it is formed at a various kind of positions based on where airing layer or an impurity region to which the via hole should be connected is formed. For example, as shown in FIG. 6A, a via hole 111A is opened in a position near the center in the width direction of a trench interconnect 113 and a via hole 111B is opened in a position near an edge, as shown in FIG. 6B. As described above, the second resist film 108 is not formed with the uniform thickness into the trench interconnect 113, but the second resist film 108 is formed with a film thickness in the region of both edge sides of an interconnect trench 107 being larger than that in the region of the middle of the interconnect trench 107, as shown in FIG. 6B. For this reason, if a pattern of the photo mask 109 having a via hole pattern 111A and 111B is transferred to the second resist film 108 to made a second resist pattern 110 for forming a via hole is formed, the resist pattern 110 is formed to have a pattern opening 110A having substantially the same size as a via hole pattern 111A. However, on the other hand, the resist pattern 110 is formed to have a pattern opening 110B having a tapered shape in the depth direction of the opening in the region on both sides of the interconnect trench 107 because the exposure at the bottom of the second resist film 108 decreases due to the resist film thickness being large in the region on both sides of the interconnect trench 107. With the result that although the size of the pattern opening 110B on the surface of the second resist film 108 is formed to have substantially the same size as the via hole pattern 111B, the size of the pattern opening 110B at the boundary between the second resist film 108 and an interlayer dielectric 103, i.e., on the bottom surface of the second resist film 108, becomes smaller than the via hole pattern 111B. Therefore, if a via hole is opened by etching the interlayer dielectric 103 by use of such a resist pattern as a mask, the diameter size of a via hole 121A formed in the middle region becomes almost as designed, however, the diameter size of a vie hole 121B formed in the edge region on both sides becomes smaller than a design size, thus a via resistance of the via hole 121B is larger than it is designed.

As described above, a size of a via hole transformed in substance from a photo mask to a photo resist film varies due to a lack of uniformity of a film thickness of the photo resist film, which is caused by a surface shapes i.e. a surface concavity and convexity (uneven surface) of an underlayer film due to steps of an underlying layer.

It should be noted that a size of a pattern that is actually transferred to a photo resist film is discussed in Japanese Patent Laid-Open No.2000-292903 (hereinafter, a referential document 1) and Japanese Patent Laid-Open No. 2001-85583 (hereinafter, a referential document 2). In the referential document 1, it is pointed out that the size of a pattern actually transferred to the photo resist film is affected by the difference in thickness of the photo resist film. However, the document 1 does not address at all about how and where the difference in thickness of the resist film is generated. Especially, it does not recognize that a surface concavity and convexity of an underlayer which is to be selectively etched by use of a photo resist film, causes variation in film thickness of that photo resist film. Rather, in accordance with the teachings of the referential document 1, a variation of the actually-transferred size of the pattern caused by the film thickness of a photo resist film is solved by providing an anti-reflection layer on and/or under the photo resist layer. In addition, the document 1 suggests that a variation of a size of a pattern that has been actually transferred on a photo resist film is caused by the layer structure of the underlayer film which is subjected to etching, rather than by the variation of the film thickness of a photo resist film, and based on this suggestion, the size of the pattern to be transferred to the photo resist film is controlled in accordance with the analyzing result of the layer structure of the underlayer film.

On the other hand, the referential document 2 discusses that a pattern which as been actually transferred on a photo resist film, especially the size of an opening, deviates from a designed value by the number of and/or etch size of other openings which are formed near the opening is question simultaneously with one another. However, it does not recognize that a surface concavity and convexity of an underlayer film which is to be selectively etched affects a variation of a film thickness of a photo resist film, either.

SUMMARY OF THE INVENTION

The method according to the first aspect of the present invention may be applied to transfer the pattern of a mask, which has a first pattern hole and a second pattern hole being different in size from each other, to a resist film covering an underlying layer having an uneven surface. Specifically, the underlying layer is at first covered with a resist film. The underlying layer has an uneven surface so that the resist film has first and second portions which are different in thickness from each other due to the uneven surface of the underlying layer. The pattern of the mask is then transferred to the resist film to thereby form a resist pattern film. In this step, the mask having, as its pattern, first and second pattern-holes to form first and second openings respectively in the first and second portions of the resist film, and the first and second pattern-holes of the mask are different in size from each other. Thereafter, etching is performed on the underlying layer by using the resist pattern film as a mask to make first and second holes in the underlying layer. Thus, the first and second holes which have been formed in the underlying layer become substantially the same in size as each other because of the fact that the first and second pattern-holes of the mask are different in shape from each other.

The method according to the second aspect of the present invention may be applied to transfer the pattern of a mask which has a hole for defining an exposed area of a resist film to a resist film having ununiform thickness, the exposed area containing a first portion and a second portion being larger in width than a first portion. Specifically, the underlying layer is at first covered with the resist film. The resist film has a first portion and a second portion that is larger in thickness than the first portion. The pattern of the mask is then transferred to the resist film to thereby form a resist pattern film. In this step, the mask has, as its pattern, a first hole for defining a first exposed area of the resist film, the first exposed area of the resist film containing respective parts of the first and second portions of the resist film, and the first and second portions are formed in such a manner that the part of the first portion of the resist film is smaller in width than the part of the second portion of the resist film. Thereafter, etching is performed on the underlying layer by using the resist pattern film as a mask to form a first opening in the underlying layer. Thus, the first opening is thereby formed with a width that is substantially equal to the width of the part of the first portion of the resist film.

In the method according to the third aspect of the present invention, if the exposed area of a resist film defined by the opening of a photo-mask is detected to cover respective part of a first portion of the resist film and a second portion of the resist film that is larger in thickness than the first portion, the opening is formed in such a manner that the part of the second portion of the resist film is larger in width than the part of the first portion of the resist film. Specifically, it is detected whether the exposed area of the resist film defined by the opening of the photo-mask is within the first portion of the resist film, covers respective parts of the first and second portions of the resist film, or is within the second portion of the resist film. The resist film has the first portion and the second portion that is larger in thickness than the first portion. If the exposed area defined by the opening is detected to cover respective parts of the first and second portions of the resist film, the opening is formed in such a manner that the part of the second portion of the resist film is larger in width than the part of the first portion of the resist film. The opening defines an exposed area of a resist film which is used as a mask film to selectively etching a layer underlying the resist film and to make the hole in the layer. Thus, the hole is formed in the layer with a width that is substantially equal to the width of the part of the first portion of the resist film.

As described above, a resist mask which is formed in the present invention may be free from dimensional errors of pattern caused by a difference in the resist film thickness, which is ascribed to the level-difference portion of the underlying layer. Furthermore, the present invention may provide a design method of the mask pattern for forming the resist mask.

BRIEF DESCRIPTION OF THE DRAWINGS

Features of the illustrative, non-limiting embodiments of the present invention will be more apparent from the following description taken in conjunction with the accompanying drawings, in which.

DETAILED DESCRIPTION OF THE PREFERRED EMBODIMENTS

The following description of the embodiments discloses specific configurations, features, and operations. However, the embodiments are merely examples of the present invention, and thus, the specific features described below are merely used to more easily describe such embodiments and to provide an overall understanding of the present invention. Accordingly, one skilled in the art will readily recognize that the present invention is not limited to the specific embodiments described below. Furthermore, the descriptions of various configurations, features, and operations of the present invention that would have been known to one skilled in the art are omitted for the sake of clarity and brevity.

Figure 1A:
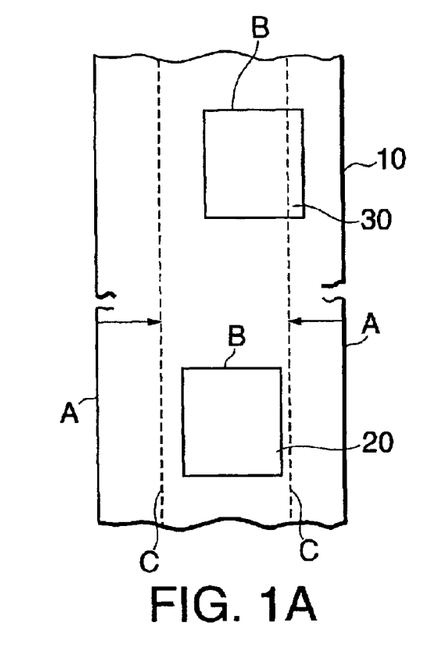
FIGS. 1A–1D illustrate a method of designing a mask pattern in an embodiment of the present invention.

These embodiments are examples in which the invention is applied to a trench first process by the dual-damascene method. FIG. 1A is a plan view of design data of a mask pattern for forming via holes of dual-damascene interconnect. On the bottom surface of a trench interconnect 10 having a prescribed interconnect width formed in the preceding process are disposed a plurality of via holes, two via holes 20, 30 in this case. One via hole 20 is disposed in a position near the middle of the trench interconnect 10 and the other via hole 30 is disposed in a position near one side edge of the trench interconnect 10. As shown in FIGS. 5A to AD, the interlayer dielectric 103 is formed on the conductive layer 102 of the underlying layer, and by use of the first photo mask 105 and first resist pattern 106, the interconnect trench 107 is formed in this interlayer dielectric 103 and after that, the via hole 111 (20, 30) is formed by use of the second photo mask 109 and second resist pattern 110 formed on the basis of each of the via data of these via holes 20, 30.

If the second photo mask is formed by use of the via data of the via holes 20, 30 shown in FIG. 1A as they are and the second resist pattern is formed by use of the second resist film on the basis of this second photo mask, in the same way as shown in FIG. 6 the resist pattern opening of the via hole 20 in a position near the middle trench interconnect 10 is formed almost to the design size and hence the pattern opening of the via hole 20 is formed almost to the design size. However, because the resist pattern opening of the via hole 30 formed in a position near the side edge of the trench interconnect 10 has a taper shape with an opening width gradually decreasing downward, there is a fear that the pattern opening of the via hole 30 may be formed with a size smaller than the design size.

Figure 1B:
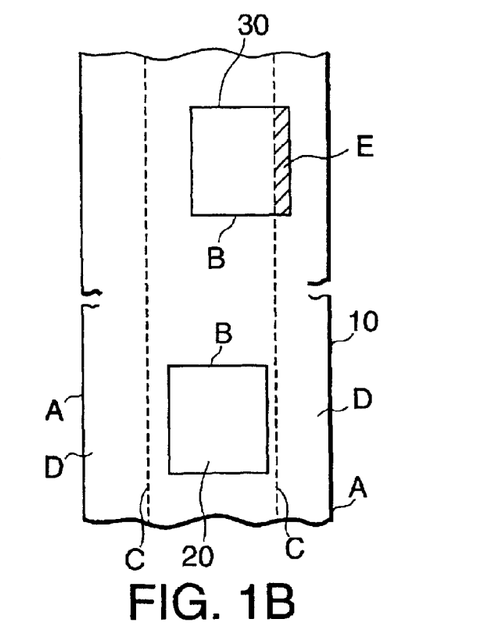
Figure 1C:
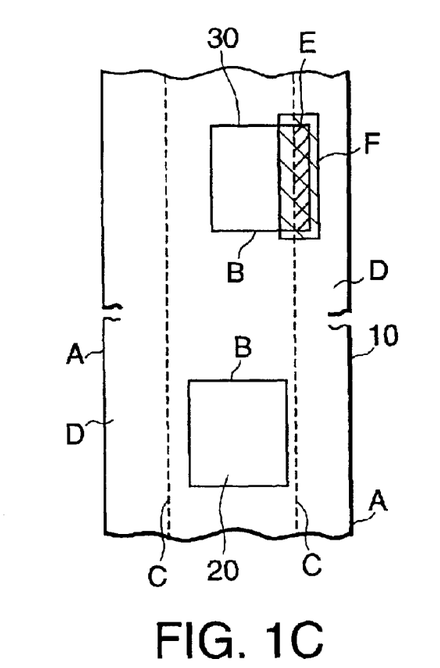
Figure 1D:
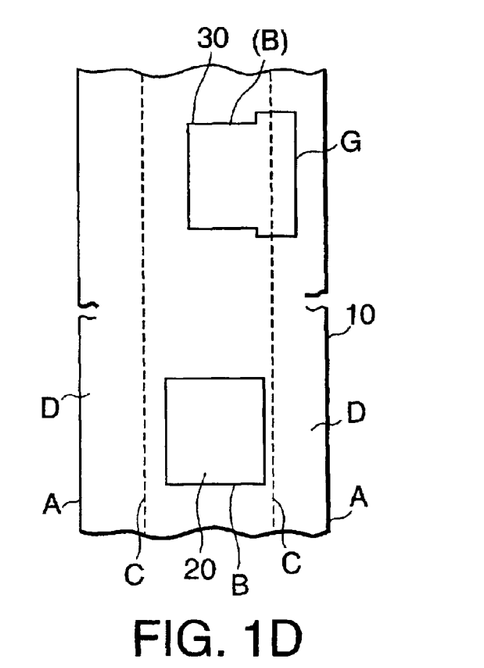

In these embodiments, therefore, the mask pattern (mask hole) for forming via holes in the second photo mask is designed by a process which will be described below. In these embodiments, as shown in FIG. 1A, the data for forming the trench interconnect 10 having an interconnect width of 0.48 μm is called the trench interconnect data A and the data for forming the via hole the length of one side of which is 0.2 μm is called the via data B. First, as indicated by dashed lines in FIG. 1A, data for forming a corrected trench interconnect having an interconnect width reduced by 0.12 μm by isotropically reducing the trench interconnect data A is defined as the corrected trench interconnect data C. That is, a corrected trench interconnect having an interconnect width of 0.24 μm is obtained by imaginarily moving the two-side edges of the trench interconnect, which provide the level difference produced in the underlying layer, by 0.12 μm inward. And as shown in FIG. 1B, the complementary set of this corrected trench interconnect data C is called the corrected complementary set data D and the product-set B∩D of the above-described complementary set data D and via data B is called the product-set data E. That is, a region of via data B that protrudes with respect to the corrected trench interconnect data C (a region that overlaps the complementary set data D) is called the product-set data E. And as shown in FIG. 1C, by isotropically expanding the above-described product-set data E, there is found expanded data F for forming a pattern, which is obtained by expanding by 0.02 μm the pattern formed by use of the product-set data E. In other words, defined as expanded data F is data which is capable of forming a pattern whose width is expanded by 0.02 μm from a pattern formed by use of the product-set data E by expanding the product-set data E, which is a region of via data B that protrudes from the corrected trench interconnect data C. After that, as shown in FIG. 1D, the sum-set B∪F of the original via data B and expanded data F is taken and is called the corrected via data G. That is, after this corrected via dada G is replaced by the first via data B, a mask pattern of the above-described photo mask is designed on the basis of this corrected via data G.

In other words, when a corrected trench interconnect whose interconnect width is reduced from the interconnect size of the original trench interconnect is supposed, the region of the via hole that protrudes from this corrected trench interconnect is expanded by the size of 0.02 μm. The region on both sides of this corrected trench interconnect, i.e., the region between the original trench interconnect and the corrected trench interconnect is a region where, as shown in FIG. 6B, the film thickness becomes larger than in other regions after the coating of the second resist film. Therefore, the region in which the film thickness of this second resist film increases, i.e., data obtained by increasing the size of the via data B in the complementary data D is called the expanded data F. The corrected via data G that is finally obtained as the sum-set of the original via data B and expanded data F is regarded as the via data of mask pattern design data of the second photo mask.

On the other hand, for the via hole 20 near the middle of the trench interconnect 10, the sum-set data E is zero if the corrected trench interconnect data C is found and the sum-set of this complementary set D and via data B is taken. That is, because in the via data of the via hole 20 there is no region that protrudes on both sides of corrected trench interconnect data C, the product-set data E and expanded data F are not created and the corrected via data G remains as the original via data B. Therefore, in the region near the middle of the interconnect trench where the film thickness of the second resist film is uniform, the corrected via data G is in agreement with the original via data B.

Figure 2A:
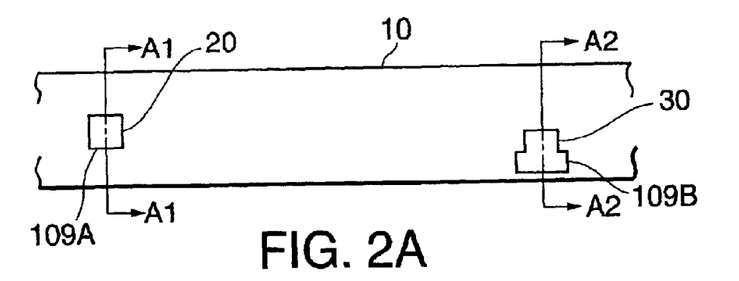
FIGS. 2A–2C show schematic views resist patterns in an embodiment of the present invention.
Figure 2B:
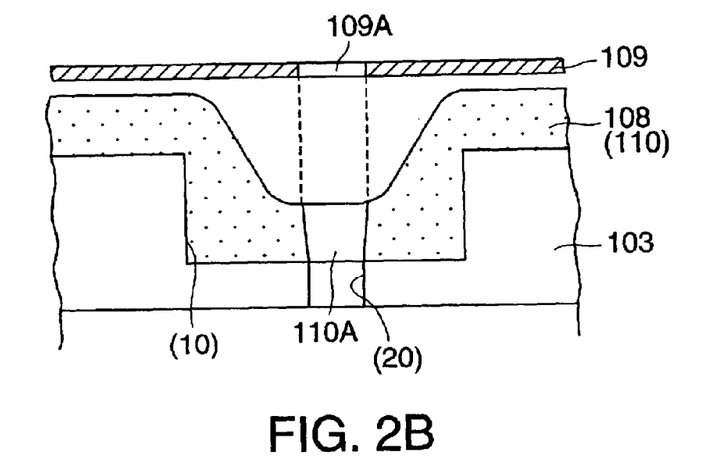
Figure 2C:
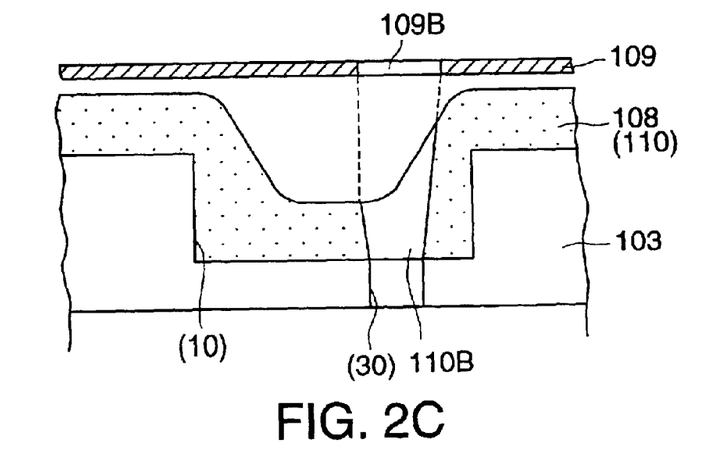

When a second photo mask 109 is formed by use of the corrected via data G obtained by the above-described design method as shown in FIG. 2A, then as shown in the sectional views FIG. 2B and FIG. 2C, which are taken along lines A1—A1 and A2—A2, respectively, of FIG. 2A, a mask pattern 109A near the middle of a trench interconnect 10 is formed to the original design data and a mask pattern 109B near both sides of the trench interconnect 10 becomes a pattern by obtained by expanding part of the size of the design data. Therefore, when the second resist pattern 110 is formed by performing the exposure and development of a second resist film 108 by use of this photo mask 109, a pattern opening 110A is formed to the design data, as shown in FIG. 2B, in a region of uniform film thickness near the middle of the trench interconnect, whereas in a region of large film thickness near both sides of the trench interconnect 10, as shown in FIG. 2C, a pattern opening 110B in which the opening size on the top surface side is larger than the design size due to a tapered sectional shape but the opening size on the bottom surface side is almost the same as the design size. In order to form via holes 20, 30 of the same size, the opening size on the top surface of pattern opening 110B of the second resist film is set in such a manner that the size of the via hole 30 becomes substantially the same as the size of the via hole 20. In other words, in order to form via holes 20, 30 of the same size, the opening size on the top surface of the pattern opening 110B of second resist pattern is set in such a manner that the opening size on the bottom surface of the pattern opening 110B of second resist film becomes substantially the same as the opening size of the pattern opening 110A. In these embodiments, in short, the opening size of the pattern opening 110A and the opening size on the bottom surface of the pattern opening 110B are set so that both become substantially the same, and the opening size on the top surface of the pattern opening 110B is set so as to become larger than these opening sizes.

The corrected trench interconnect data C is set at an appropriate value corresponding to the size of a region of nonuniform film thickness that occurs in the second resist film 108 in the region on both sides of the trench interconnect 10. That is, when the depth of the interconnect trench is large, the value of data C tends to become large because the region of large film thickness of the second resist film 108 becomes wide.

As described above, in these embodiments a mask pattern of a via hole is designed as a mask pattern corrected by increasing, by a prescribed size, the via data included in the range at a prescribed distance from a position where the level difference of underlying layer is present, whereby it becomes possible to prevent the occurrence of dimensional errors of a resist pattern caused by the nonuniformity of the film thickness of a resist film, which is ascribed to the level difference of underlying layer. For this reason, plurality of holes being substantially the same in size as each other in an underlying layer having an uneven surface.

Figure 3A:
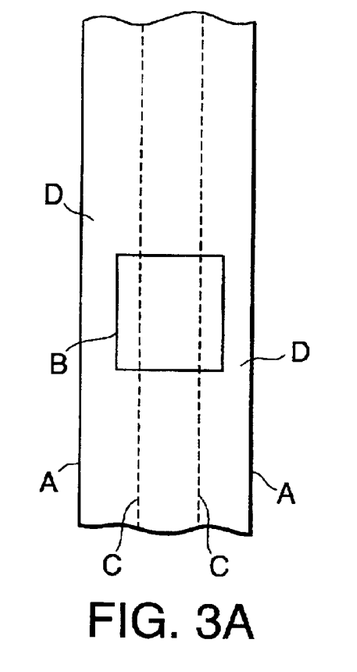
FIGS. 3A–3D illustrate a method of designing a mask pattern in another embodiment of the present invention.
Figure 3B:
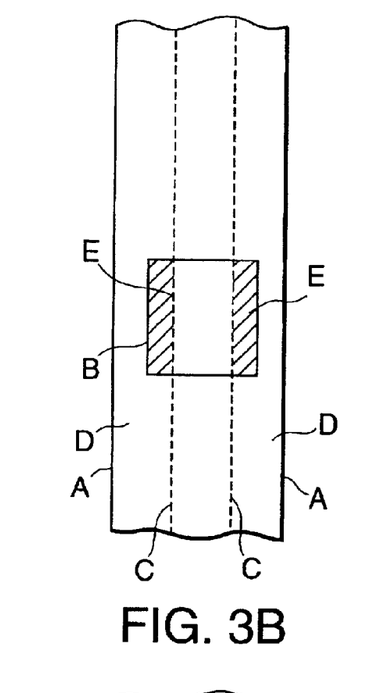
Figure 3C:
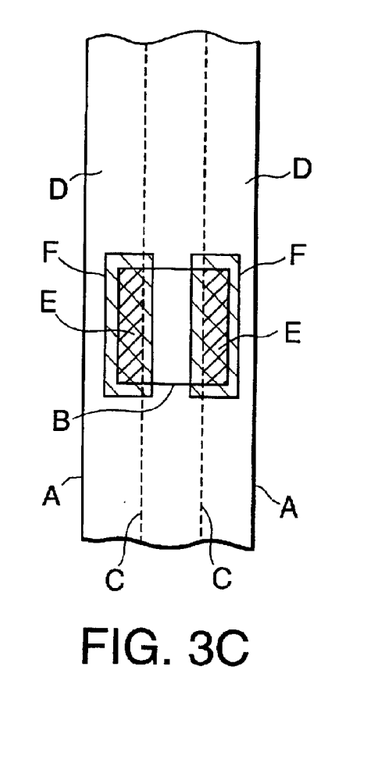
Figure 3D:
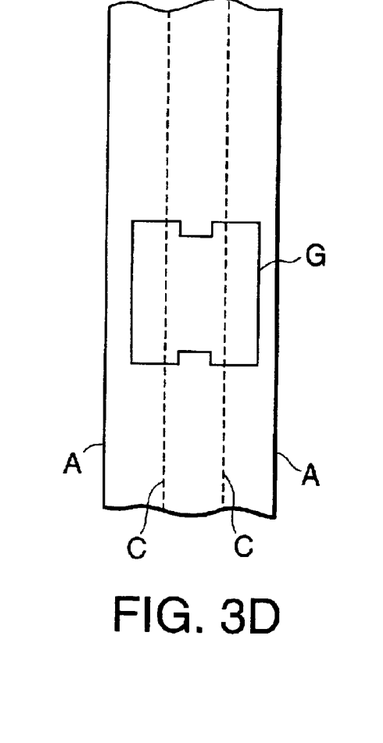

In the above-described embodiments were shown examples in which for the via hole disposed in the region near both sides of the interconnect trench, the design of a portion of this via hole in close vicinity to the side edges of the interconnect trench in question is corrected. In another embodiment, according to the size and arrangement position of a via hole, it is possible to correct the side on both sides of the via hole or sides that intersect at right angles. For example, FIG. 3A shows an example in which the proportion of the size of a via hole 40 to the size of a trench interconnect 10 is relatively large in comparison with the above-described embodiments. In this case, the width of the trench interconnect 10 is 0.4 $\mu$m and the side size of the via hole 40 is 0.3 $\mu$m. For this design data, the corrected trench interconnect data C is created by isotropically reducing the trench interconnect data A by 0.12 $\mu$m. Subsequently, as shown in FIG. 3B, the complementary set data D of the above-described corrected trench interconnect data C is found and the product-set B∩D of this complementary set data., and via data B is regarded as the product-set data E. After that, as shown in FIG. 3C, expanded data F is found by isotropically expanding the product-set data E by 0.02 $\mu$m. Subsequently, as shown in FIG. 3D, the sum-set B∩F of the original via data B and expanded data F is taken and is called the corrected via data G. When the mask pattern of the second photo mask is formed on the basis of this corrected via data G, a mask pattern of a via hole in which the size is expanded on both sides of the original via data B is formed.

Figure 4A:
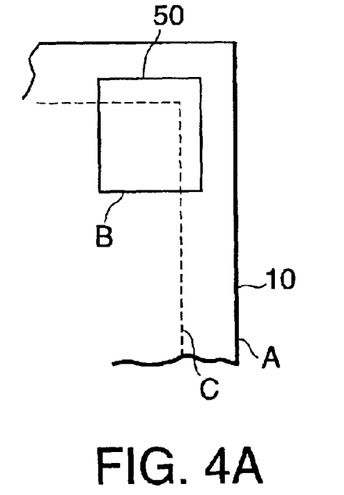
FIGS. 4A–4D illustrate a method of designing a mask pattern in other embodiment of the present invention.
Figure 4B:
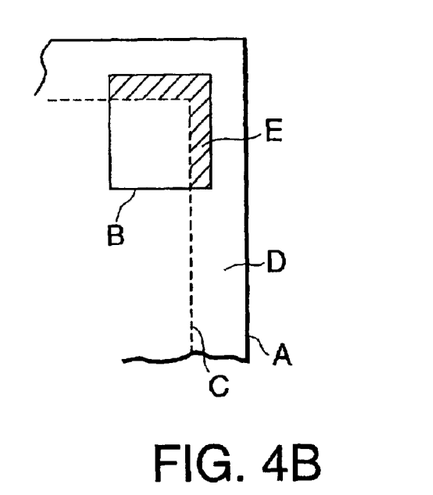
Figure 4C:
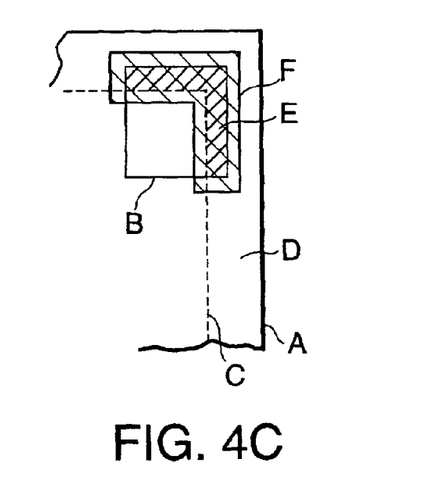
Figure 4D:
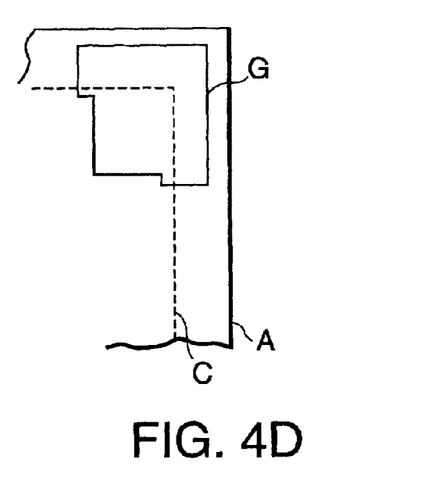

Also, FIG. 4A shows an example in which a via hole 50 is disposed in a region of the end portion of a trench interconnect 10, and for the design data, corrected trench interconnect data C is formed by isotropically reducing the trench interconnect data A by 0.12 $\mu$m. Subsequently, when as shown in FIG. 4B, complementary set data D of this corrected trench interconnect data C is found, this complementary set data D is generated by the adjoining sides of the via hole 50 that intersect at right angles. Subsequently, the product-set B∩D of the above-described complementary set data D and via data B is called the product-set data E. Subsequently, as shown in FIG. 4C, expanded data F is found by isotropically expanding the above-described sum-set data E by 0.02 $\mu$m. Subsequently, as shown in FIG. 4D, the sum-set B∪F of the original via data B and expanded data F is taken and is called the corrected via data G. When the mask pattern of the second photo mask is formed on the basis of this corrected via data G, a mask pattern of a via hole in which the size is expanded toward each of the side edge and end edge of the trench interconnect 10 is formed.

Incidentally, the above-described embodiments show examples in which the invention is applied to the lithography technology of via holes in the trench first process of a dual-damascene interconnect. However, the invention is not limited to the above-described embodiments and can also be applied to any process if the surface of the underlying layer have projections and depressions and the process involves forming a desired resist mask pattern in the depressions by use of lithography technology.

The present invention is not limited to the above embodiments, and it is contemplated that numerous modifications may be made without departing from the spirit and scope of the invention. The semiconductor device, as described above with reference to the figures, is a merely an exemplary embodiment of the invention, and the scope of the invention is not limited to these particular embodiments. For example, the specific layers and their dimensions and materials that are used to create the semiconductor devices of the non-limiting embodiments are merely examples, and one skilled in the art will readily know that the present invention can be applied to devices containing different layers and their dimensions and materials. Accordingly, other structural configurations maybe used, without departing from the sprit and scope of the invention as defined in the claims.

What is claimed is:

1. A method of manufacturing a semiconductor device, comprising:

covering an underlying layer with a resist film, said underlying layer having an uneven surface so that said resist film has first and second portions which are different in thickness from each other due to said uneven, surface of said underlying layer;

transferring a pattern of a mask to said resist film to thereby form a resist pattern film, said mask having first and second pattern-holes to form first and second openings respectively in said first and second portions of said resist film, said first and second pattern-holes of said mask being different in size from each other; and etching said underlying layer by using said resist pattern film as a mask to make first and second holes in said underlying layer, said first and second holes being substantially the same size as each other due to said first and second pattern-holes of said mask being different in size from each other.

2. The method as claimed in claim 1, wherein said uneven surface of said underlying layer is caused by a depressed portion selectively formed in said underlying layer, said first portion of said resist film covering a central portion of said depressed portion and said second portion of said resist film covering a peripheral portion of said depressed portion.

3. The method as claimed in claim 2, wherein said depressed portion and said first and second holes of said underlying layer being filled with a conductive layer.

4. The method as claimed in claim 1, wherein said first portion of said resist film is smaller in thickness than said second portion of said resist film and said first pattern-hole of said mask is smaller in size than said second pattern-hole of said mask.

5. The method as claimed in claim 1, wherein said uneven surface of said underlying layer is caused by a depressed portion selectively formed in said underlying layer, said first portion of said resist film covering a central portion of said depressed portion and said second portion of said resist film covering a peripheral portion of said depressed portion, said first portion of said resist film being smaller in thickness than said second portion of said resist film, and said first pattern-hole of said mask being smaller in size than said second pattern-hole of said mask.

6. The method as claimed in claim 5, wherein said depressed portion and said first and second holes of said underlying layer being filled with a conductive layer.

7. The method as claimed in claim 1, wherein said second opening of said resist pattern film has a first size on a side of said mask and a second size on a side of said underlying layer, said first size being different in square measure from said second size.

8. The method as claimed in claim 7, wherein said second size is smaller in square measure than said first size.

9. The method as claimed in claim 8, wherein said method further comprises forming a wiring trench in said underlying layer before covering said underlying layer with said resist layer, said wiring trench defined by a bottom plane which caves from an adjacent surface of said underlying layer, and wherein said first hole and said second hole are formed by excavating from said bottom plane.

10. The method as claimed in claim 9, wherein said second opening is arranged to be closer to an edge of said bottom plane than said first opening.

11. A method of manufacturing a semiconductor device, comprising:

covering an underlying layer with a resist film, said resist film having a first portion and a second portion that is larger in thickness than said first portion;

transferring a pattern of a mask to said resist film to thereby form a resist pattern film, said mask having a first hole for defining a first exposed area of said resist film, said first exposed area of said resist film containing respective parts of said first and second portions of said resist film and being formed in such a manner that the part of said first portion of said resist film is smaller in width than the part of said second portion of said resist film; and etching said underlying layer by using said resist pattern film to form a first opening in said underlying layer, said first opening being thereby formed with a width that is substantially equal to the width of the part of said first portion of said resist film.

12. The method as claimed in claim 11, wherein said mask further has a second hole for defining a second exposed area of said resist film, said second exposed area of said resist film being within said first portion and formed in such a manner as being substantially equal in width to the part of said first portion of said resist film, and said etching said underlying layer by using said resist pattern film further forming a second opening that is substantially equal in width to said first opening.

13. The method as claimed in claim 12, wherein said first and second portions are formed by a depressed portion that is selectively formed in said underlying layer, said first portion of said resist film covering a central portion of said depressed portion and said second portion of said resist film covering a peripheral portion of said depressed portion, and said depressed portion and said first and second openings of said underlying layer being filled with a conductive layer.

14. The method as claimed in claim 11, wherein said first and second portions are formed by a depressed portion that is selectively formed in said underlying layer, said first portion of said resist film covering a central portion of said depressed portion and said second portion of said resist film covering a peripheral portion of said depressed portion, and said depressed portion and said first opening of said underlying layer being filled with a conductive layer.

* * * * *